United States Patent
Hill et al.

(10) Patent No.: US 7,470,632 B2
(45) Date of Patent: *Dec. 30, 2008

(54) METHOD OF DEPOSITING A SILICON DIOXIDE COMPRISING LAYER DOPED WITH AT LEAST ONE OF P, B AND GE

(75) Inventors: Chris W. Hill, Boise, ID (US); Weimin Li, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 595 days.

This patent is subject to a terminal disclaimer.

(21) Appl. No.: 11/204,509

(22) Filed: Aug. 16, 2005

(65) Prior Publication Data

US 2006/0035471 A1 Feb. 16, 2006

Related U.S. Application Data

(63) Continuation of application No. 10/420,246, filed on Apr. 21, 2003, now Pat. No. 6,930,058.

(51) Int. Cl.
  *H01L 21/31* (2006.01)
  *H01L 21/469* (2006.01)
(52) U.S. Cl. .............................. 438/778; 257/E21.279
(58) Field of Classification Search ............. 438/778; 257/E21.279
See application file for complete search history.

(56) References Cited

U.S. PATENT DOCUMENTS

| 4,371,587 | A | * | 2/1983 | Peters ..................... 428/446 |
| 5,665,635 | A | | 9/1997 | Kwon et al. |
| 5,786,262 | A | | 7/1998 | Jang et al. |
| 6,946,368 | B1 | * | 9/2005 | Vandroux et al. ........... 438/475 |
| 2004/0115898 | A1 | | 6/2004 | Moghadam et al. |

FOREIGN PATENT DOCUMENTS

EP   1 054 444 A1   11/2000

* cited by examiner

*Primary Examiner*—Marcos D. Pizarro
*Assistant Examiner*—Igwe U. Anya
(74) *Attorney, Agent, or Firm*—Wells St. John P.S.

(57) ABSTRACT

A substrate is positioned within a deposition chamber. At least two gaseous precursors are fed to the chamber which collectively comprise silicon, an oxidizer comprising oxygen and dopant which become part of the deposited doped silicon dioxide. The feeding is over at least two different time periods and under conditions effective to deposit a doped silicon dioxide layer on the substrate. The time periods and conditions are characterized by some period of time when one of said gaseous precursors comprising said dopant is flowed to the chamber in the substantial absence of flowing any of said oxidizer precursor. In one implementation, the time periods and conditions are effective to at least initially deposit a greater quantity of doped silicon dioxide within at least some gaps on the substrate as compared to any doped silicon dioxide deposited atop substrate structure which define said gaps.

45 Claims, 2 Drawing Sheets

US 7,470,632 B2

METHOD OF DEPOSITING A SILICON DIOXIDE COMPRISING LAYER DOPED WITH AT LEAST ONE OF P, B AND GE

RELATED PATENT DATA

This patent resulted from a continuation application of U.S. patent application Ser. No. 10/420,246, filed Apr. 21, 2003, entitled "Method of Depositing a Silicon Dioxide Comprising Layer Doped With at Least One of P, B and Ge", naming Chris W. Hill, Weimin Li and Gurtej S. Sandhu inventors, now U.S. Pat. No. 6,930,058, the disclosure of which is incorporated by reference.

TECHNICAL FIELD

This invention relates to methods of methods of depositing silicon dioxide comprising layers doped with at least one of P, B and Ge.

BACKGROUND OF THE INVENTION

Silicon dioxide is a regularly used insulating material in semiconductor processing in the fabrication of integrated circuitry. One particular class of silicon dioxides are those doped with at least one of phosphorus, boron and germanium. Examples include phosphosilicate glass (PSG), borosilicate glass (BSG) and borophosphosilicate glass (BPSG). Such materials might be utilized as fill material in trench isolation, as interlevel dielectrics, and as well as in many other applications. A typical manner of depositing such materials is by chemical vapor deposition (CVD), which includes atomic layer deposition. In one exemplary CVD process, silicon, dopant and oxidizing precursors are continuously fed to a deposition reactor under conditions effective to in situ deposit a doped silicon dioxide layer on a substrate received therein. Alternately by way of example only, a substantially undoped silicon dioxide layer can be formed first, followed by ion implanting or diffusion doping of the desired dopants therein.

A usual or typical goal in silicon dioxide layer depositions is to attain a conformal covering over the substrate. A substantially conformal deposition is characterized by a substantially constant deposition thickness over all of a substrate, including over the high elevation areas, the low elevation areas, and the interconnecting surfaces therebetween. However in many such processes, a non-conformal deposition occurs whereby more material tends to deposit on the higher elevation substrate features than on the lower or lowest elevation of gaps between features. This can lead to "bread loafing" and the ultimate occlusion of the gaps resulting in undesirable void formation within the gaps. Such can be overcome with doped silicon dioxides as described above by a high temperature anneal/reflow step whereby the doped silicon dioxide is substantially liquified, thereby flowing to fill the gaps. However, such is not always effective, adds additional processing steps, and may not be practical as device geometries continue to be decreased horizontally without a corresponding decrease in the vertical geometries of the circuitry.

While the invention was motivated in addressing the above issues and improving upon the above-described drawbacks, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes methods of depositing silicon dioxide comprising layers doped with at least one of P, B and Ge. In one implementation, a substrate is positioned within a deposition chamber. At least two gaseous precursors are fed to the chamber which collectively comprise silicon, an oxidizer comprising oxygen and dopant which become part of the deposited doped silicon dioxide. The feeding is over at least two different time periods and under conditions effective to deposit a doped silicon dioxide layer on the substrate. The time periods and conditions are characterized by some period of time when one of said gaseous precursors comprising said dopant is flowed to the chamber in the substantial absence of flowing any of said oxidizer precursor. In one implementation, the time periods and conditions are effective to at least initially deposit a greater quantity of doped silicon dioxide within at least some gaps on the substrate as compared to any doped silicon dioxide deposited atop substrate structure which define said gaps.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
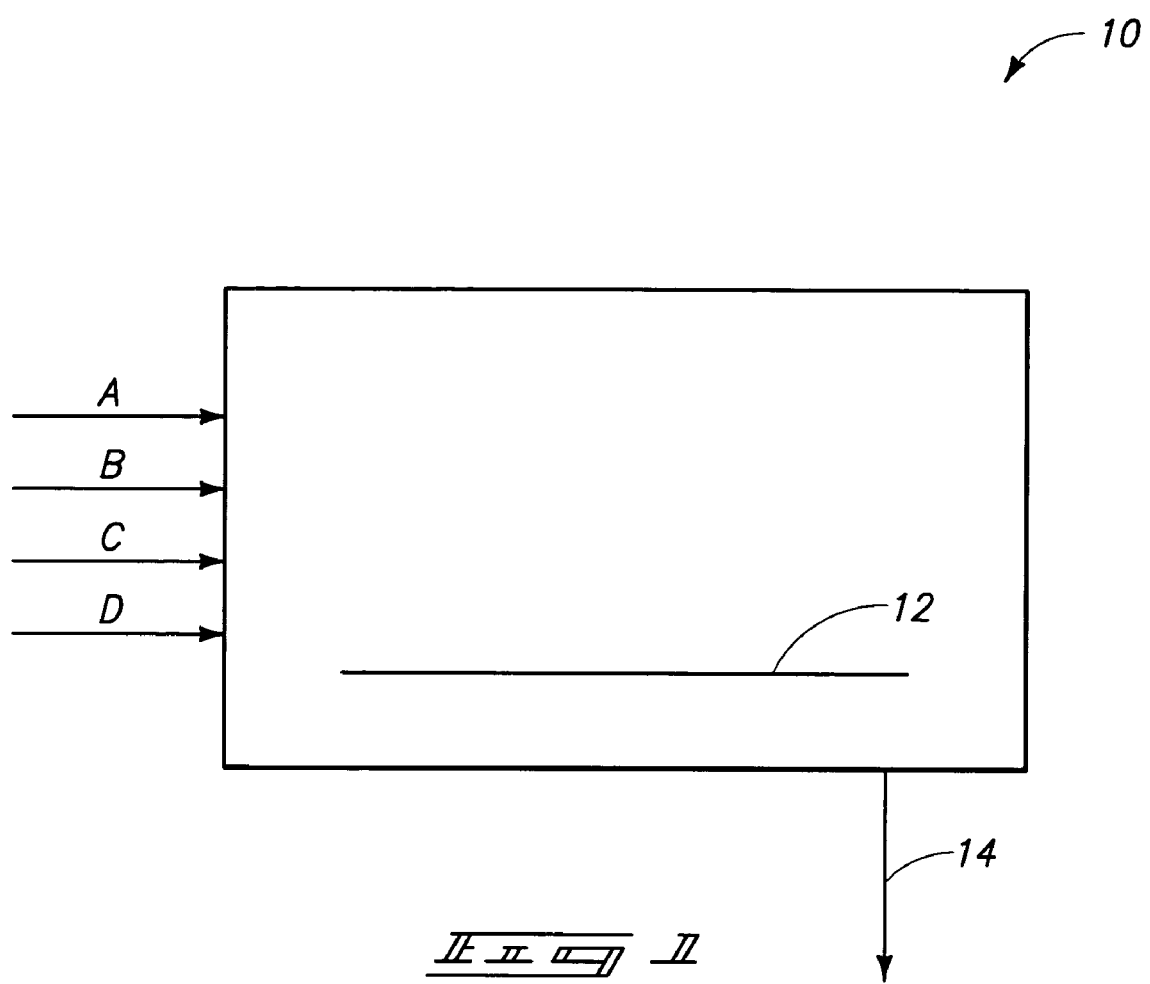
FIG. 1 is a diagrammatic depiction of a deposition chamber usable in accordance with an aspect of the invention.

An exemplary method of depositing a silicon dioxide comprising layer doped with at least one of P, B and Ge is described, by way of example only, with reference to FIG. 1 Such depicts any suitable deposition chamber 10 having a substrate 12 positioned therein. Preferably, substrate 12 comprises a semiconductor substrate upon which integrated circuitry has been or is being fabricated. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Chamber 10 is diagrammatically depicted as having four gas inlet streams A, B, C, and D. Of course, more or fewer streams/flows could also be utilized, and also with any of such being combined upstream of deposition chamber 10. In one preferred embodiment, such would ultimately feed to a showerhead (not shown) which would be received above substrate 12. An exemplary vacuum controlling drawdown/exhaust line 14 extends from chamber 10 for exhausting unreacted gas and by-product from the substrate, and for controlling chamber pressure.

In accordance with one aspect of the invention, the substrate to be deposited upon is positioned within a deposition chamber, for example substrate 12 within an exemplary deposition chamber 10. At least two gaseous precursors are fed to the chamber with such precursors collectively comprising silicon, an oxidizer comprising oxygen, and dopant which become part of the doped silicon dioxide layer being deposited. The feeding is over at least two different time periods and under conditions effective to deposit a doped silicon dioxide layer on the substrate. The time periods and conditions are characterized by some period of time when one of the gaseous precursors comprising the dopant is flowed to the chamber in the substantial absence of flowing any of the oxidizer precursor. In one preferred embodiment, the "some" period of time is repeated multiple times during the deposition.

In the context of this document, "in the substantial absence" means no greater than 1% of the subject precluded precursor flowing to the reactor in the subject period of time as compared to the sum of all other precursors flowed to the reactor, excluding inert gaseous material. The "no greater than 1%" refers to or is calculated as a volumetric ratio of the flow rates of the subject precursors in sccm, not factoring in any carrier gas flow. In certain preferred implementations, the "substantial absence" is further limited to mean no detectable level or levels of the subject/precluded precursor being flowed to the chamber during the subject time period.

In one preferred aspect, such time periods and conditions are effective to at least initially deposit a greater quantity of doped silicon dioxide within at least some gaps on the substrate as compared to any doped silicon dioxide deposited atop substrate structures which define such gaps. An exemplary reduction-to-practice example is described below.

The ultimate dopant could comprise any one or a combination of P, B and Ge. By way of example only, an exemplary precursor for phosphorus dopant is TEPO (triethylorthophosphate) of the formula $P(OC_2H_5)_3$. An exemplary precursor for boron is TEB (triethylborate) of the formula $B(C_2H_5)_3$. An exemplary precursor for germanium is germane ($GeH_4$).

The substrate temperature and/or chamber pressure might be substantially constant during the subject feedings, or not be substantially constant. In the context of this document and with respect to temperature, "substantially constant" means maintaining within 5% in ° C., and with respect to pressure means within 5% in Torr. Further, any of such feedings might include plasma generation or be in the absence of plasma. Where plasma generation is conducted, such could occur in one or both of within the chamber and remote from the chamber.

In one preferred implementation, the time period when one of the gaseous precursors comprising the dopant is flowed to the chamber in the substantial absence of flowing any of the oxidizer precursor also occurs in the substantial absence of flowing any of the precursor comprising the silicon which gets deposited onto the substrate.

The respective of at least some of the different time periods might overlap or none of the time periods overlap. In one preferred embodiment, there is some period of time intermediate two different periods of time that do not overlap which is characterized by a substantial absence of any precursor flow to the chamber, and in one more preferred embodiment characterized by an inert gas flow to the chamber intermediate such two different periods.

Exemplary preferred precursors constituting an oxidizer which comprises oxygen which predominately ends up in the incorporated silicon dioxide layer include ozone and activated oxygen, for example by plasma generation. By way of example only, an alternate example includes $N_2O$ and other $NO_X$ materials.

In one implementation, a method of depositing PSG comprises positioning a substrate within a deposition chamber. At least TEOS, TEPO and another oxygen containing gas are fed to the chamber as reaction precursors over a plurality of time periods and under conditions effective to deposit a PSG comprising layer on the substrate. The time periods and conditions are characterized by a first period of time when at least one of the TEOS and TEPO flows to the chamber in the substantial absence of the other oxygen containing gas to the chamber. Further, the time periods and conditions are characterized by a second period of time following the first when the other oxygen containing gas flows to the chamber in the substantial absence of flowing any of the TEOS and TEPO to the chamber. The first period of time might be characterized by flowing both the TEOS and TEPO to the chamber at the same time. Alternately by way of example only, the first period of time might be characterized by flowing only one of the TEOS and TEPO to the chamber in the substantial absence of flowing the other. Further in such latter example, the time periods and conditions might be characterized by a third period of time following the second when the other of the TEOS and TEPO flows to the chamber in the substantial absence of flowing the TEOS or TEPO which was flowed to the chamber during the first period of time and also in the substantial absence of flowing the other oxygen containing gas to the chamber. Attributes as described above could also be utilized in this implementation, as well as other attributes.

In one implementation, a method of depositing a silicon dioxide comprising layer doped with at least one or P, B and Ge includes positioning a substrate within a deposition chamber. At least an "a" precursor, a "b" precursor and a "c" precursor are fed to the chamber. The "a" precursor comprises silicon which becomes part of the deposited doped silicon dioxide. The "b" precursor comprises an oxidizer comprising oxygen which becomes part of the deposited doped silicon dioxide. The "c" precursor comprises dopant which becomes part of the deposited doped silicon dioxide. As above, an exemplary "a" precursor is a silane, such as monosilane. An exemplary "b" precursor is ozone, activated oxygen and/or $N_2O$. Exemplary "c" precursors would, of course, depend on the desired doped silicon dioxide layer being deposited and, by way of example only, could include any one or combination of TEPO, TEB and germane.

The feeding of such "a", "b" and "c" precursors is over at least three different respective time periods and under conditions effective to deposit a doped silicon dioxide layer on the substrate. The time periods and conditions are characterized by some period of time when the "c" precursor is flowed to the chamber in the substantial absence of flowing any of the "b" precursor, and more preferably also in the substantial absence of flowing any of the "a" precursor. In one exemplary embodiment, there is another period of time characterized by flowing both the "c" precursor and the "a" precursor to the chamber at the same time.

Again and as with the above-described embodiment, some of the stated time periods might overlap, or none of the stated time periods overlap. Further where two time periods do not overlap, there may be some period of time intermediate two of the time periods which is characterized by a substantial absence of any precursor flow to the chamber, and further by way of example only, characterized by an inert gas flow to the chamber in the substantial absence of any precursor flow to the chamber.

The above-described feeding involving "a", "b" and "c" precursors can be considered in a collection as constituting some cycle. In one preferred embodiment, the subject feedings occur over a plurality of repeating such cycles of "a" precursor, "b" precursor and "c" precursor flowings to the chamber. Of course, a respective/individual cycle might include only one, or more than one, of any one of the "a", "b" and "c" precursor flowings. In one preferred embodiment, individual of repeating cycles are characterized by two "b" precursor flows for every "a" plus "c" precursor flows.

Some of the above-described attributes in a combination are described with respect to Table 1 below regarding but one exemplary reduction-to-practice example. However, such example is not intended to be limiting to the breadth of the disclosure, unless literally so limited in a particular claim under analysis. The invention is contemplated and defined in the accompanying claims as literally worded, without limiting or interpretative reference to the specification.

A preferred substrate temperature during the depositions and processings of Table 1 are from 200° C. to 600° C., with such processing occurring with a substantially constant substrate temperature of 350° C., and in a cold wall reactor not under plasma conditions. A preferred pressure range during the depositions and processings is from 1 Torr to 200 Torr, with the pressure varying between 2 Torr and 6 Torr. A spacing from the showerhead to the substrate surface was constant during the processings at 230 mills. An exemplary preferred ozone flow is from 100 sccm to 10,000 sccm, with 800 sccm being utilized in the below example. Such preferred ozone flow rates include $O_2$ flow, with the above such flow rates preferably comprising from 1% to 20% by volume $O_3$. In the example below, the ozone concentration was 12.5% by volume. TEOS and TEPO were provided to the reactor by flowing an inert gas at the rate of 12 sccm through respective vaporizers to transfer the subject vapor to the chamber. Preferred TEOS flow rates for a six liter volume reactor are from 50 mg/minute to 1000 mg/minute, with 600 mg/minute being transferred by the flowing helium in the example below. A preferred TEPO flow rate range is from 50 mg/minute to 500 mg/minute, with 200 mg/minute being transferred by the flowing helium in the example below.

TABLE 1

| Time Period | 1 | 2 | 3 | 4 | 5 | 6 | 7 | 8 |
|---|---|---|---|---|---|---|---|---|
| $O_3$ | off | off | on | off | off | off | on | off |
| TEOS | on | off | off | off | off | off | off | off |
| TEPO | off | off | off | off | on | off | off | off |
| Pulse Time (secs) | 3 | 10 | 10 | 10 | 3 | 10 | 10 | 10 |

Table 1 depicts a first period of time over 3 seconds characterized by TEOS flow and no ozone or TEPO flow. This was followed by a second period of time characterized by the substantial absence of flowing any of the ozone, TEOS and TEPO to the chamber. Alternately and perhaps more preferred would be some continuous flowing of an inert gas to the chamber, for example helium, argon and/or nitrogen, during any time period depicted with all "off" flows.

The second time period was followed by a third time period in which ozone was flowed to the chamber while no TEOS or TEPO was flowed to the chamber. The third period of time was then followed by a fourth period of time in which no gas was flowed to the chamber. This was then followed by a fifth period of time in which TEPO flowed to the chamber in the substantial absence of any ozone or TEOS flows. A sixth period of time followed the fifth, and in which no precursor gases were flowed to the chamber. This was followed by a seventh period of time in which ozone flowed to the chamber in the substantial absence of any TEOS or TEPO flowing to the chamber. An eighth period of time followed the seventh, and in which none of the ozone, TEOS or TEPO precursors flowed to the chamber. The above cycle is then repeated.

The deposition rate for the Table 1 indicated cycle was a 3 to 5 Angstroms thick layer of doped silicon dioxide in the form of PSG. Such a process initially formed a greater quantity of the doped silicon dioxide within the gaps on the substrate as compared to any doped silicon dioxide which deposited atop the substrate structure which defined such gaps.

By way of example only, such a process might be used to ultimately deposit a doped silicon dioxide layer having a thickness of anywhere from 3 Angstroms to 1,500 Angstroms. At some point, it is expected that the deposition would become substantially conformal, particularly after the gaps have been substantially filled.

Figure 2:
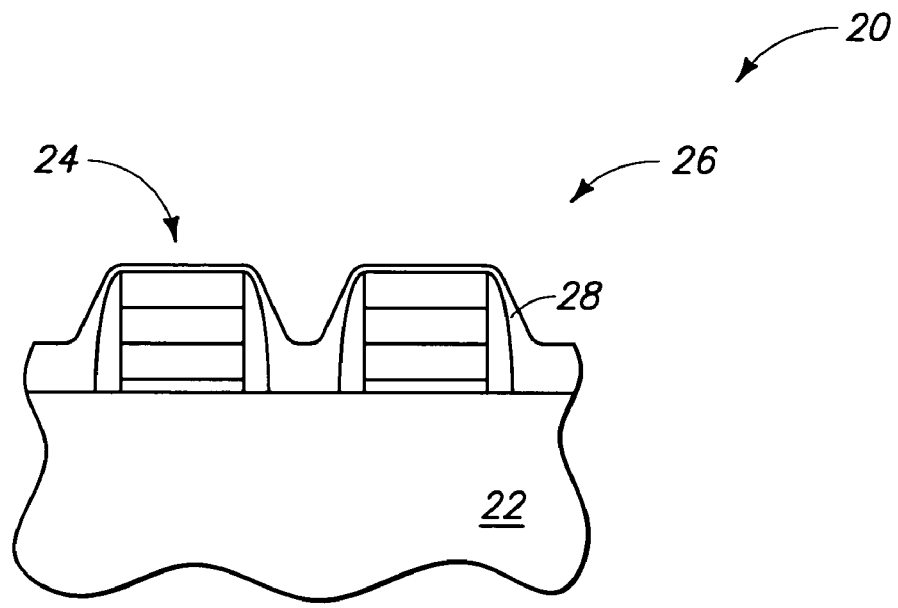
FIG. 2 is a diagrammatic section view of a substrate fragment processed in accordance with an aspect of the invention.
Figure 3:
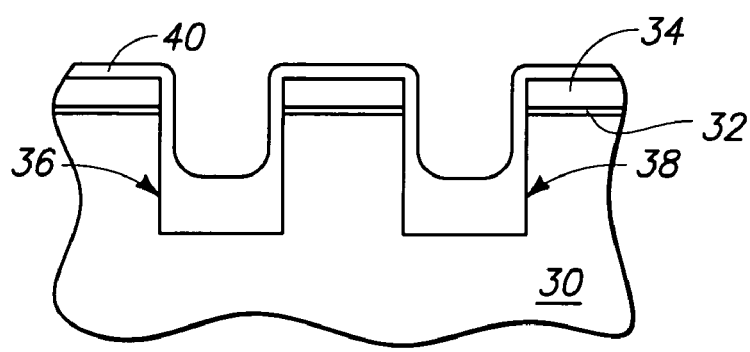
FIG. 3 is a diagrammatic section view of another substrate fragment processed in accordance with an aspect of the invention.

By way of example only, FIGS. 2 and 3 depict substrate structures wherein the invention might be utilized. FIG. 2 depicts a substrate 20 comprising a base substrate 22 having a pair of gate constructions 24 and 26 formed thereover. By way of example only, such are shown as being characterized by an insulating cap received over a conductive refractory metal silicide layer, received over a conductively doped polysilicon layer, received over a gate dielectric layer (not designated with numerals). Anisotropically etched sidewall spacers are received thereabout. An exemplary doped silicon dioxide layer 28 has been deposited, for example in accordance with the above-described Table 1 or other embodiments, wherein layer 28 at least initially deposits a greater quantity of the doped silicon dioxide within the gaps between gate construction 28 as compared to atop structures 24 and 26 which define such gap.

FIG. 3 depicts similar exemplary processing with respect to shallow trench isolation (STI), and by way of example only. FIG. 3 depicts a bulk semiconductor substrate 30 having a pad oxide layer 32 and a silicon nitride masking layer 34 formed thereover. Shallow trenches 36 and 38 have been etched into the respective materials, as shown. By way of example and as described above, a doped silicon dioxide layer 40 has been deposited to provide, at least initially, a greater quantity of doped silicon dioxide within the trench gaps on the substrate as compared to any doped silicon dioxide which might be deposited atop the adjacent substrate structure that defines such gaps.

Of course, with respect to the Table 1 reduction-to-practice example, any additional processing steps might be added, or some of the processing steps deleted or modified. By way of example only and in no way of limitation, the TEOS and TEPO flows could be reversed and/or only a single ozone flow provided in the indicated cycle.

The mechanism by which such deposition occurs is not entirely understood, but the following may be what is happening. This disclosure is in no way intended to be limited by any perceived theory of operation, whether correct or incorrect, unless so limited in a particular claim under analysis. The deposition mechanism might include some aspects of ALD or ALD-like processing, as well as by vapor or other phase reaction. The particular deposition method may have ALD-like aspects in that one or more of the precursors may be chemisorbing to the substrate as such substrate exists when the respective precursor is flowed to the chamber. However unlike ALD, the above-described processing in the reduction-to-practice example was not self-limiting relative to the different precursor flows. Accordingly, it is perceived that some of the flowing precursor might by physisorbing and/or chemisorbing to internal reactor surfaces as well as to the substrate desired to be deposited upon, and thereby are available for reaction when a subsequent precursor is flowed to the chamber. Further, such physisorbed and/or chemisorbed material may be providing a vapor phase reaction and immediate subsequent deposition onto the substrate without the formation of monolayers typical in ALD. Further, it is possible that a combination of the above and ALD-like processing is occurring during deposition.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of depositing a silicon dioxide-comprising layer doped with at least one of phosphorus, boron, and germanium, comprising:
   placing a semiconductor a substrate within a deposition chamber; and
   introducing at least two gaseous precursors into the chamber, said precursors collectively comprising silicon, an oxidizer comprising oxygen and at least one of phosphorus, boron, and germanium dopant, said introducing performed over at least two different time periods and under conditions effective to deposit a doped silicon dioxide layer on the substrate, wherein said gaseous precursor comprising said dopant is introduced into the chamber during a time interval during which substantially no oxidizer precursor is introduced into said chamber, such that at some point during the depositing of said doped silicon dioxide, said doped silicon dioxide is preferentially deposited within at least some gaps on the substrate relative to atop substrate structure adjacent said gaps.

2. The method of claim 1 wherein said time interval is characterized by introducing said gaseous precursor comprising said dopant into the chamber in the substantial absence of introducing any of said precursor comprising said silicon into the chamber.

3. The method of claim 1 wherein none of the different time periods overlap.

4. The method of claim 1 wherein at least some of the different time periods overlap.

5. The method of claim 1 wherein at least some of the different time periods do not overlap.

6. The method of claim 5 comprising some period of time intermediate two different time periods that do not overlap which is characterized by a substantial absence of any precursor being introduced into the chamber.

7. The method of claim 5 comprising some period of time intermediate two different time periods that do not overlap in which an inert gas flows into the chamber in the substantial absence of any precursor being introduced into the chamber.

8. The method of claim 1 wherein said introducing comprises repeating said time interval multiple times.

9. The method of claim 1 wherein said introducing is in the absence of plasma.

10. The method of claim 1 wherein said introducing comprises plasma generation.

11. The method of claim 10 wherein the plasma generation is within the chamber.

12. The method of claim 10 wherein the plasma generation is remote from the chamber.

13. A method of depositing a silicon dioxide-comprising layer doped with at least one of phosphorus, boron, and germanium, comprising:
    placing a semiconductor substrate within a deposition chamber; and
    introducing at least an "a" precursor, a "b" precursor and a "c" precursor into the chamber, the "a" precursor comprising silicon, the "b" precursor being an oxidizer comprising oxygen, and the "c" precursor comprising the at least one of phosphorus, boron, and germanium, said introducing performed over at least three different respective time periods and under conditions effective to deposit a doped silicon dioxide layer on the substrate, wherein the "c" precursor is introduced into the chamber during a time interval during which substantially no "b" precursor is introduced into said chamber, such that at some point during the depositing of said doped silicon dioxide, said doped silicon dioxide is preferentially deposited within at least some gaps on the substrate relative to atop substrate structure adjacent said gaps.

14. The method of claim 13 wherein at least two of the three time periods overlap.

15. The method of claim 13 wherein none of the three time periods overlap.

16. The method of claim 13 comprising some period of time intermediate two of the three time periods which is characterized by a substantial absence of any precursor being introduced into the chamber.

17. The method of claim 13 comprising some period of time intermediate two of the three time periods that do not overlap in which an inert gas flows into the chamber in the substantial absence of any precursor being introduced into the chamber.

18. The method of claim 13 wherein the "c" precursor comprises P.

19. The method of claim 13 wherein the "c" precursor comprises B.

20. The method of claim 13 wherein the "c" precursor comprises Ge.

21. The method of claim 13 wherein the introducing occurs over a plurality of repeating cycles of "a" precursor, "b" precursor and "c" precursor introducings into the chamber.

22. The method of claim 21 wherein individual cycles are characterized by two "b" precursor introducings for every "a" plus "c" precursor introducings.

23. The method of claim 13 wherein said time interval is characterized by introducing said "c" precursor into the chamber in the substantial absence of introducing any of said "a" precursor into the chamber.

24. The method of claim 13 comprising some period of time characterized by introducing both said "c" precursor and said "a" precursor into the chamber at the same time.

25. A method of depositing PSG comprising:
    placing a semiconductor substrate within a deposition chamber; and
    introducing at least TEOS, TEPO and another oxygen containing gas as reaction precursors into the chamber, said introducing being over a plurality of time periods and under conditions effective to deposit a PSG comprising layer on the substrate;

the time periods including a first period of time when at least one of said TEOS and TEPO is introduced into the chamber during which substantially none of said another oxygen containing gas is introduced into the chamber; and the time periods including a second period of time following the first when said another oxygen containing gas is introduced into the chamber during which substantially none of said TEOS and TEPO is introduced into the chamber, such that at some point during the depositing of said doped silicon dioxide, said doped silicon dioxide is preferentially deposited within at least some gaps on the substrate relative to atop substrate structure adjacent said gaps.

26. The method of claim 25 wherein the first period of time is characterized by only one of said TEOS and TEPO being introduced into the chamber in the substantial absence of introducing said other of said TEOS and TEPO into the chamber; and the time periods including a third period of time following the second when said other of said TEOS and TEPO is introduced into the chamber in the substantial absence of flowing said TEOS or TEPO flowed during the first time period and in the substantial absence of introducing said another oxygen containing gas into the chamber.

27. The method of claim 25 wherein the first and second time periods do not overlap.

28. The method of claim 27 comprising some period of time intermediate the first and second periods of time which is characterized by a substantial absence of any precursor introducing into the chamber.

29. The method of claim 27 comprising some period of time intermediate the first and second periods of time in which an inert gas flows into the chamber in the substantial absence of any precursor introducing into the chamber.

30. The method of claim 25 wherein the introducing occurs over a plurality of repeating cycles of the first and second time periods with their associated precursor introducings.

31. The method of claim 30 wherein individual cycles are characterized by two another oxygen-containing gas introducings for every TEPO plus TEOS introducings.

32. The method of claim 25 wherein said first period of time is characterized by introducing both said TEPO and TEOS into the chamber at the same time.

33. A method of depositing a silicon dioxide-comprising layer doped with at least one of phosphorus, boron, and germanium, comprising:

placing a semiconductor substrate within a deposition chamber;

introducing at least an "a" precursor, a "b" precursor and a "c" precursor into the chamber, the "a" precursor comprising silicon, the "b" precursor comprising oxygen, and the "c" precursor comprising the at least one of phosphorus, boron, and germanium, said introducing performed over a plurality of time periods and under conditions effective to deposit a doped silicon dioxide layer on the substrate;

the time periods including a first period of time when either said "a" or said "c" precursor is introduced into the chamber during which substantially none of said "a" and "c" precursor is introduced into the chamber and during which substantially none of said "b" precursor is introduced into the chamber;

the time periods including a second period of time following the first during which substantially none of said "a", "b" and "c" precursors is introduced into the chamber;

the time periods including a third period of time following the second when said "b" precursor is introduced into the chamber during which substantially none of said "a" and "c" precursors is introduced into the chamber;

the time periods including a fourth period of time following the third during which substantially none of said "a", "b" and "c" precursors is introduced into the chamber;

the time periods including a fifth-period of time following the fourth when said other of said "a" and "c" precursors flows into the chamber during which substantially none of said "a" or "c" precursor introduced during the first time period and substantially none of said "b" precursor is introduced into the chamber;

the time periods including a sixth period of time following the fifth during which substantially none of said "a", "b" and "c" precursors is introduced into the chamber;

the time periods including a seventh period of time following the sixth when said "b" precursor is introduced into the chamber during which substantially none of said "a" and "c" precursors is introduced into the chamber;

the time periods including an eighth period of time following the seventh during which substantially none of said "a", "b" and "c" precursors is introduced into the chamber; and such that at some point during the depositing of said doped silicon dioxide, said doped silicon dioxide is preferentially deposited within at least some gaps on the substrate relative to atop substrate structure adjacent said gaps.

34. The method of claim 33 wherein "a" comprises TEOS and "c" comprises TEPO.

35. The method of claim 33 wherein "a" comprises TEOS and "c" comprises TEB.

36. The method of claim 33 wherein "a" comprises TEOS and "c" comprises $GeH_4$.

37. The method of claim 33 wherein said first through eighth periods of time comprise a cycle, and further comprising repeating the cycle.

38. The method of claim 33 wherein said first through eighth periods of time comprise a cycle, and further comprising repeating the cycle multiple times.

39. The method of claim 33 wherein substrate temperature is substantially constant during the first through the eighth periods of time.

40. The method of claim 33 wherein chamber pressure is substantially constant during the first through the eighth periods of time.

41. The method of claim 33 wherein substrate temperature and chamber pressure are substantially constant during the first through the eighth periods of time.

42. The method of claim 33 wherein the substantially nones are below respective detectable levels.

43. The method of claim 33 wherein said introducing comprises plasma generation.

44. The method of claim 43 wherein the plasma generation is within the chamber.

45. The method of claim 43 wherein the plasma generation is remote from the chamber.

* * * * *

UNITED STATES PATENT AND TRADEMARK OFFICE
CERTIFICATE OF CORRECTION

| | | |
|---|---|---|
| PATENT NO. | : 7,470,632 B2 | Page 1 of 1 |
| APPLICATION NO. | : 11/204509 | |
| DATED | : December 30, 2008 | |
| INVENTOR(S) | : Hill et al. | |

It is certified that error appears in the above-identified patent and that said Letters Patent is hereby corrected as shown below:

In column 10, line 11, in Claim 33, delete "fifth-period" and insert -- fifth period --, therefor.

Signed and Sealed this

Twenty-fourth Day of March, 2009

JOHN DOLL
*Acting Director of the United States Patent and Trademark Office*